(12) United States Patent
Imamiya et al.

(10) Patent No.: US 6,898,119 B2
(45) Date of Patent: May 24, 2005

(54) NONVOLATILE SEMICONDUCTOR MEMORY AND ITS TEST METHOD

(75) Inventors: Kenichi Imamiya, Tokyo (JP); Koichi Kawai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/919,282

(22) Filed: Aug. 17, 2004

(65) Prior Publication Data

US 2005/0018483 A1 Jan. 27, 2005

Related U.S. Application Data

(63) Continuation of application No. 10/617,400, filed on Jul. 11, 2003, now Pat. No. 6,807,102.

(30) Foreign Application Priority Data

Jul. 12, 2002 (JP) ........................................ 2002-204442

(51) Int. Cl.⁷ ............................................. G11C 16/06
(52) U.S. Cl. ............................ 365/185.09; 365/185.22; 365/185.29; 365/185.3
(58) Field of Search ....................... 365/185.09, 185.22, 365/185.29, 185.3

(56) References Cited

U.S. PATENT DOCUMENTS

| 5,297,029 | A |   | 3/1994 | Nakai et al. |
| 5,570,315 | A | * | 10/1996 | Tanaka et al. ......... 365/185.22 |
| 6,222,779 | B1 |   | 4/2001 | Saito et al. |
| 6,762,956 | B1 | * | 7/2004 | Mori et al. ............ 365/185.33 |

OTHER PUBLICATIONS

K. Imamiya, et al., IEEE Journal of Solid–State Circuits, vol. 34, No. 11, pp. 1536–1543, "A 130–nm", 256–Mbit NAND Flash With Shallow Trench Isolation Technology", Nov. 1999.

K–D. Suh, et al., ISSCC95/Session 7/Flash Memory/Paper TA 7.5, Digest of Technical Papers, pp. 128–129, A 3.3V 32Mb NAND Flash Memory with Incremental Step Pulse Programming Scheme, Feb. 16, 1995.

* cited by examiner

Primary Examiner—Connie C. Yoha
(74) Attorney, Agent, or Firm—Oblon, Spivak, McClelland, Maier & Neustadt, P.C.

(57) ABSTRACT

A nonvolatile semiconductor memory is disclosed, which comprises a nonvolatile memory cell array, a write circuit which repeatedly executes a write and a verification, and a write voltage control circuit, the write voltage control circuit comprising a first binary counter which counts a first clock signal supplied every time the verification fails and supplies output data to the write circuit, a first register which stores data for setting the number of erases and verifications, a second binary counter which is reset using a first timing, counts a second clock signal supplied if a verify write executed on the target write unit fails, an accumulative value storage circuit which is reset using a second timing and stores a value corresponding to an accumulative value for the contents of the second binary counter, and a nonvolatile storage element which stores the appropriate value for the write start voltage.

12 Claims, 9 Drawing Sheets

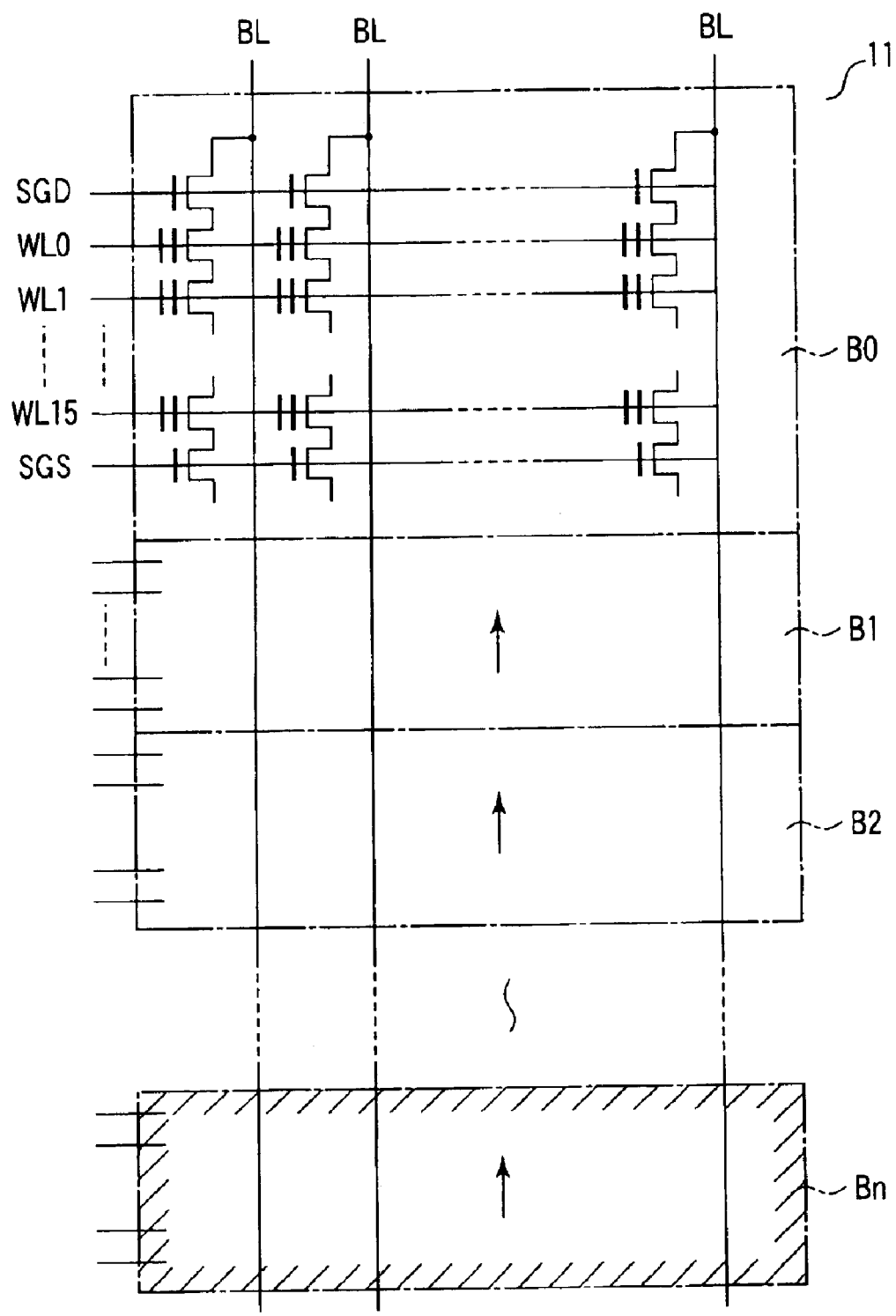
F I G. 2

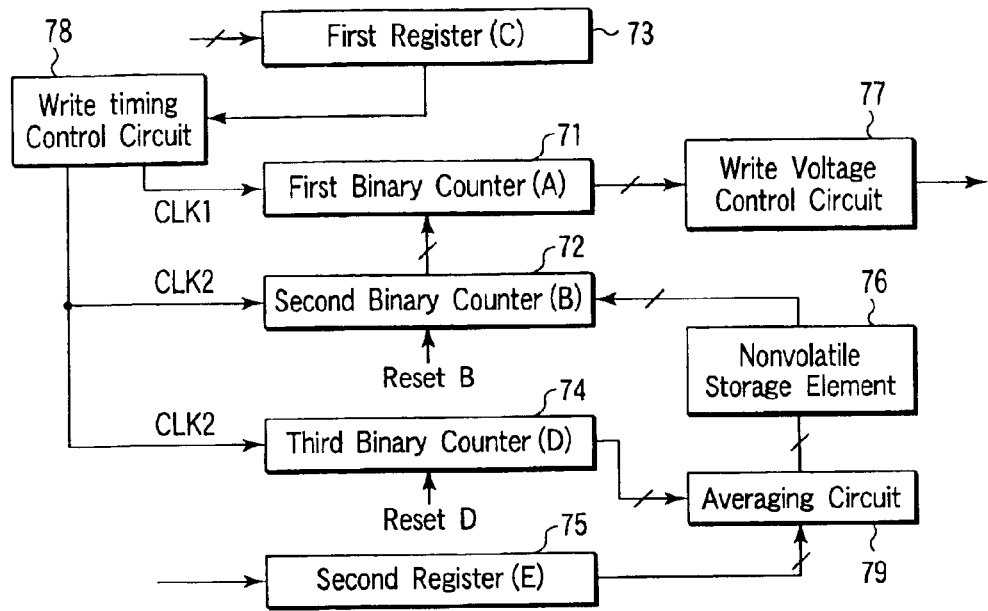
F I G. 7A
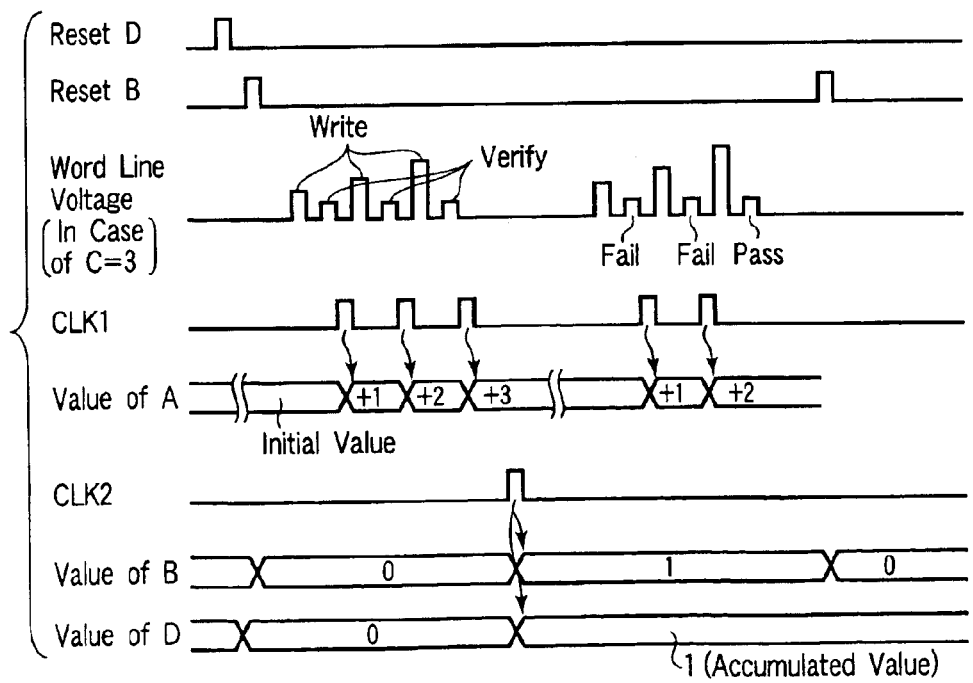
F I G. 7B

NONVOLATILE SEMICONDUCTOR MEMORY AND ITS TEST METHOD

CROSS-REFERENCE TO RELATED APPLICATIONS

This application is a continuation of and claims the benefit of priority under 35 USC §120 from U.S. application Ser. No. 10/617,400, filed Jul. 11, 2003, now U.S. Pat. No. 6,807,102 and is based upon and claims the benefit of priority under 35 USC §119 from Japanese Patent Application No. 2002-204442, filed Jul. 12, 2002, the entire contents of which are incorporated herein by reference.

BACKGROUND OF THE INVENTION

1. Field of the Invention

The present invention relates to a nonvolatile semiconductor memory and its test method, and in particular, to a circuit that sets an initial value for a write voltage and an initial value for an erase voltage both of which are used for a nonvolatile semiconductor memory that carries out verify writes and verify erasures, as well as a test method for this circuit. The present invention is applicable to, for example, a NAND type flash memory.

2. Description of the Related Art

A NAND type flash memory, a kind of nonvolatile semiconductor memory, has been published in documents such as "K. Imamiya et. al. "A 130-mm$^2$ 256-Mb NAND Flash with Shallow Trench Isolation Technology", IEEE J. Solid State Circuits, Vol. 34, pp. 1536–1543, Bov. 1999".

For such a nonvolatile semiconductor memory, voltage trimming and the redundancy repair of bad cells are carried out during a wafer test sequence.

FIG. 15 is a flow chart showing schematically a wafer test sequence for a conventional NAND type flash memory.

Description will be given of operations performed during the sequence.

In a DC test, contact checks and DC checks for a standby current or the like are conducted. In Vref (reference voltage) trimming, the reference voltage Vref of each chip on a wafer is monitored. Then, a trimming value is calculated which is required to correct the monitored reference voltages to a target value.

Then, Vpgm (write voltage) initial value trimming is carried out. An incremental step pulse programming scheme is employed for the NAND type flash memory to increase a write voltage Vpgm step by step starting with its initial value. This method is described in, for example, "K. D. Suh et. al., "A 3.3 V 32 Mb NAND Flash Memory with Incremental Step Pulse Programming Scheme", ISSCC Digest of Technical Papers, pp. 128 to 129, February 1995".

This write method requires the initial value of Vpgm to be optimized so that a write time (or the number of write loops) does not exceed a predetermined time (the number of times). To achieve this, it is necessary to find a block (good block) in a memory cell array on which a write and erasure can be successfully executed. This is because bad cells have not been subjected to a redundancy repair yet.

When a good block is found, the optimum value is determined by executing a write on this block while varying the initial value of Vpgm.

Subsequently, a phase cut for voltage trimming is carried out. During this step, the wafer is transferred to a laser blow apparatus and a phase cut is executed in accordance with the trimming value determined by the Vref trimming and the Vpgm initial value trimming.

Subsequently, bad columns and rows are detected. In this case, bad columns and rows are detected by writing several data patterns in the memory cell array for a redundancy repair.

Then, a redundancy phase cut is carried out. In this case, the wafer is transferred to the laser blow apparatus again and a phase cut for a redundancy repair is executed.

In this flow chart, the phase cut for voltage trimming is carried out before the detection of bad columns and rows because if the detection of bad columns and rows is executed with incorrect internally generated voltages such as Vpgm, it may be impossible to find defects.

The time required for a wafer test sequence such as the one described above is reflected in the cost of the chip. Accordingly, in order to reduce the chip cost, it is necessary to minimize the test time while conducting required tests.

In the above described wafer test sequence, a factor relating to an increased test time is the presence of the phase cut step. Before carrying out a phase cut using a laser blow, the wafer must be removed from the tester and then transferred to the laser blow apparatus. This results in a temporal overhead. In particular, in the above described wafer test sequence, two phase cuts must be executed. Consequently, the overhead is more marked.

The applicant's Jpn. Pat. Appln. KOKAI Publication No. 2001-176290 (Jpn. Pat. Appln. No. 11-351396) "Nonvolatile Semiconductor Device" describes a method of reducing the time required for the phase cut steps.

Further, the applicant has proposed in Jpn. Pat. Appln. KOKAI Publication No. 2002-117699 (Jpn. Pat. Appln. No. 2000-303854) "Nonvolatile Semiconductor Device" that a memory cell array stores information on a trimming value for a write voltage/erase voltage as well as redundancy which information be used for a nonvolatile semiconductor memory is stored in a memory cell array and that when the memory is powered on, the information be retrieved from the memory cell array and stored in a predetermined register, so that when the memory is in a normal operational state, the information on the voltage trimming value and redundancy is stored in this register.

However, in the NAND type flash memory, the initial write or erase voltage is determined on the basis of the results of a test conducted for each chip. Detailed description will be given below of problems with this determination.

FIG. 9 schematically shows a related configuration in order to describe a read/write operation performed by the NAND type flash memory.

In FIG. 9, a memory cell array 11 is composed of NAND cell units arranged in a column direction and a row direction to form a matrix. Each of the NAND cell units is comprised of electrically rewritable nonvolatile memory cells connected in series. Each of the memory cells has a stacked gate type MOS transistor structure in which a control gate and a floating gate are stacked.

The memory cell array 11 is formed on a well area insulated and separated from the other components. To erase data from a memory cell in the memory cell array 11, the following erase method is employed: an erase operation is divided into a plurality of steps so that an erase voltage applied to the well area is increased in increments of a specified value in each step starting with an initial voltage.

The memory cell array 11 is provided with a plurality of word lines and bit lines that cross one another. The plurality of word lines are selectively driven by a decoder output from a row decoder 12.

When data is read, a signal read from a memory cell in the memory cell array 11 is supplied to a page buffer 13 via a bit line. The signal is then sensed in the page buffer 13, and then outputted in unit of column to equipment located outside the chip.

When data is written, a voltage corresponding to externally supplied write data is supplied to a bit line via a page buffer 13 and the data is then written in a selected memory cell.

Word lines in the memory cell array 11 connect a plurality of NAND cell units together. The plurality of NAND cell units constitute a cell block, the minimum unit for a data erasure. A plurality of cell blocks are arranged via common bit lines.

The range of memory cells selected by one word line is called "one page". A data write operation is performed on the entire page at a time. For example, write data retained in a data register for 512 bytes is written at a time through a bit line.

FIGS. 10A and 10B show a bias relationship observed when data is written in a memory cell (cell transistor) of the NAND type flash memory.

As shown in FIG. 10A, if write data is "00", a write bias (in this example, 0V) is applied to a well area in a cell transistor. Such a cell transistor to which the write bias is applied has a threshold being shifted to the positive side because electrons are injected into a floating gate (writes are carried out).

As shown in FIG. 10B, if write data is "0", a write bias is not applied to a well area in a cell transistor, to establish a floating state. Such a cell transistor to which the write bias is not applied maintains a low threshold because no electrons are injected into a floating gate (no writes are carried out).

FIG. 11 shows a bias relationship observed in a memory cell unit when a read is executed on the NAND type flash memory. A voltage of 0 V is applied to a selected word line (in the present example, WL14). A read voltage Vread is applied to unselected word lines (in the present example, WL0 to WL13 and WL15), a gate line SGD for selected gate transistors on a bit line (BL) side, and to a gate line SGS for selected gate transistor on a common source line (SL) side. In this case, it is necessary to turn on the cell transistors for which the read voltage Vread is applied to their unselected word lines (in the present example, WL0 to WL13 and WL15) and the selected gate transistors for which the read voltage Vread is applied to their gate lines.

To achieve this, a threshold for a cell transistor with a data "0" status (written status) must lie between a selected word line voltage (0 V) and an unselected word line voltage (Vread) with a sufficient margin. However, the write characteristic of the cell transistor varies among lots, wafers, chips, and cells within the same chip.

FIG. 12 shows a variation in the threshold for a cell transistor after a write in the case in which an appropriate write bias is applied to the whole chip of the NAND type flash memory. This figure indicates that after a write, the threshold for the cell transistor does not lie between 0 V and Vread with a sufficient margin.

To avoid this situation, a variation in threshold after a write is minimized by using a method called a "verify writes in which when a write is executed on the memory, a write operation and a verify operation are repeated until the verification succeeds.

FIGS. 13 and 14 show a variation in write bias observed when a verify write is executed on the NAND type flash memory.

In the verify write, as shown in FIG. 13, while writes and verifications are being repeated, the write bias (word line voltage) is gradually increased every time a write is carried out. If a write has been executed on any cell at a voltage higher than the verify voltage, then during the next write, the write bias is not applied to this cell.

When the above described verify write is carried out during a test on a nonvolatile memory, the distribution of thresholds obtained after a write is narrow if the write is started with a sufficiently low write bias. However, if the write is started with too low a voltage, a write operation must be repeated a large number of times. This may degrade write performance.

To set the voltage (initial value) with which a verify write is started, it is necessary to set an initial value for the write voltage for each chip or a smaller unit so that the write is finished after a target number of operations because the write characteristic of the memory cell varies among chips as described previously.

However, in the related art, the initial voltage for a verify write or verify erasure is determined on the basis of the results of a test on one write or erase unit. Thus, the initial voltage is not always obtained from a group of memory cells exhibiting a typical write or erase characteristic. Therefore, disadvantageously, the trimming value is inappropriate for the initial voltage.

BRIEF SUMMARY OF THE INVENTION

According to an aspect of the present invention, there is provided a nonvolatile semiconductor memory comprising a memory chip comprising a nonvolatile memory cell array; a write circuit which repeatedly executes a write and a verification on one write unit in the memory cell array to complete a verify write on the write unit; and a write voltage control circuit which changes a write voltage in each write executed repeatedly by the write circuit, the write voltage control circuit comprising: a first binary counter which operates after an initial value for a write voltage has been set, to count a first clock signal supplied every time the verification fails and supply output data to the write circuit as data on a write voltage for each verify write; a first register which stores data for setting the number of writes and verifications on a target write unit; a second binary counter which is reset using a first timing, counts a second clock signal supplied if a verify write executed on the target write unit fails even though the verify write is repeated a number of times set in the first register, and supplies output data to the first binary counter as an initial value for the write voltage; a second register which stores the number of write units used for a test for determining an appropriate value for a write start voltage for the memory chip; an accumulative value storage circuit which is reset using a second timing and stores a value corresponding to an accumulative value for the contents of the second binary counter obtained as a result of the verify write executed on a plurality of write units corresponding to the number of times specified by the second register; and a nonvolatile storage element which stores the appropriate value for the write start voltage for the memory chip in accordance with stored contents of the accumulative value storage circuit and stored contents of the second register.

According to another aspect of the present invention, there is provided a nonvolatile semiconductor memory comprising a memory chip comprising a nonvolatile memory cell array; an erase circuit which repeatedly executes an erase and a verification on one erase unit in the memory cell array to complete a verify erase on the erase unit; and an erase voltage control circuit which changes an erase voltage in each erase executed repeatedly by the erase circuit, the erase voltage control circuit comprising: a first binary counter which operates after an initial value for an erase voltage has been set, to count a first clock signal supplied every time the verification fails and supply output data to the erase circuit as data on an erase voltage for each verify erase; a first register which stores data for setting the number of erases and verifications on a target erase unit; a second binary counter which is reset using a first timing, counts a second clock signal supplied if a verify erase executed on the target erase unit fails even though the verify erase is repeated a number of times set in the first register, and supplies output data to the first binary counter as an initial value for the erase voltage; a second register which stores the number of erase units used for a test for determining an appropriate value for an erase start voltage for the memory chip; an accumulative value storage circuit which is reset using a second timing and stores a value corresponding to an accumulative value for the contents of the second binary counter obtained as a result of the verify erase executed on a plurality of erase units corresponding to the number of times specified by the second register; and a nonvolatile storage element which stores the appropriate value for the erase start voltage for the memory chip in accordance with stored contents of the accumulative value storage circuit and stored contents of the second register.

According to a further aspect of the present invention, there is provided a method used in a nonvolatile semiconductor memory comprising an array of memory cells each having a control gate and a floating gate and a write voltage generating circuit for which an initial voltage is determined on the basis of data stored in a register, to increase, in writing data to the memory cell, a write voltage provided to the control gate, in increments of a fixed voltage starting with the initial voltage, in each of a plurality of steps into which a write operation is divided, to obtain a write voltage data reflecting characteristics of each semiconductor chip, the method comprising: setting the number of steps at a predetermined value; carrying out a self-determination test to start a write operation with a certain initial voltage and output "pass" or "fail" depending on whether or not data has been successfully written in all memory cells in one target write unit; repeating a process of changing data in the register in a direction in which the initial voltage is increased by a fixed value if a result of the self-determination test is "fail" and causing the self-determination test to be executed with an initial voltage based on the changed data until the initial voltage based on the changed data reaches a predetermined value; executing on a plurality of write units a process of changing the target write unit after the initial voltage based on the data changed by the repeating of the process reaches the predetermined value and causing the self-determination test and the process repeating to be executed; and determining an average value per write unit on the basis of accumulative data obtained by executing writes on the plurality of write units and setting, in the register, write voltage data reflecting the characteristics of each semiconductor chip.

According to a further aspect of the present invention, there is provided a method used in a nonvolatile semiconductor memory comprising an array of memory cells each having a control gate and a floating gate formed on a well region and an erase voltage generating circuit for which an initial voltage is determined on the basis of data stored in a register, to increase, in writing data to the memory cell, an erase voltage provided to the well region, in increments of a fixed voltage starting with the initial voltage, in each of a plurality of steps into which an erase operation is divided, to obtain an erase voltage data reflecting characteristics of each semiconductor chip, the method comprising: setting the number of steps at a predetermined value; carrying out a self-determination test to start an erase operation with a certain initial voltage and output "pass" or "fail" depending on whether or not data has been successfully written in all memory cells in one target erase unit; repeating a process of changing data in the register in a direction in which the initial voltage is increased by a fixed value if a result of the self-determination test is "fail" and causing the self-determination test to be executed with an initial voltage based on the changed data until the initial voltage based on the changed data reaches a predetermined value; executing on a plurality of erase units a process of changing the target erase unit after the initial voltage based on the data changed by the repeating of the process reaches the predetermined value and causing the self-determination test and the process repeating to be executed; and determining an average value per erase unit on the basis of accumulative data obtained by executing erases on the plurality of erase units and setting, in the register, erase voltage data reflecting the characteristics of each semiconductor chip.

BRIEF DESCRIPTION OF THE SEVERAL VIEWS OF THE DRAWING

FIG. 2 is a circuit diagram showing a configuration of a part of a memory cell array in the memory in FIG. 1;

FIGS. 7A and 7B are a block diagram showing an example of a circuit that sets a write start voltage (or an erase start voltage) in the NAND type flash memory in FIG. 1, as well as a timing waveform diagram showing an example of operations of this circuit, respectively;

DETAILED DESCRIPTION OF THE INVENTION

An embodiment of the present invention will be described below in detail with reference to the drawings.

Figure 1:
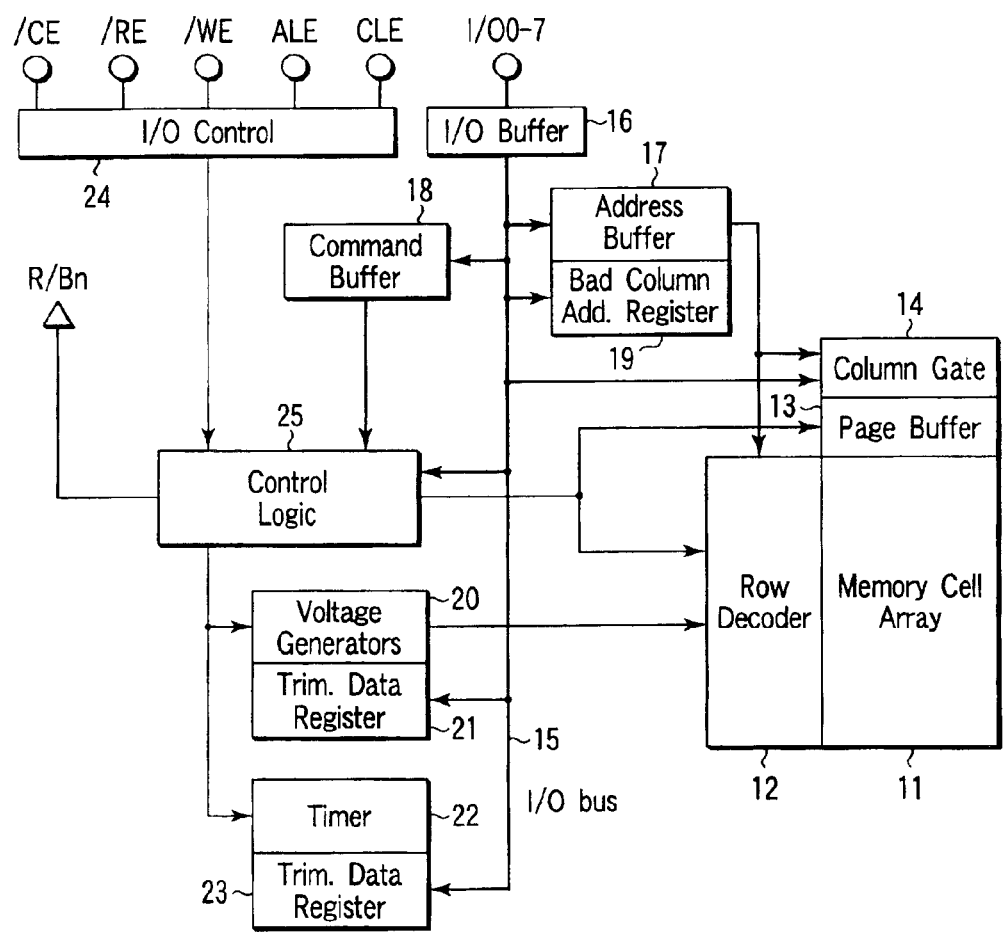
FIG. 1 is a block diagram showing schematically a block diagram of a NAND type flash memory according to an embodiment of the present invention.

FIG. 1 is a block diagram showing a block diagram of a NAND type flash memory according to an embodiment of the present invention.

In FIG. 1, a memory cell array 11 is composed of electrically rewritable nonvolatile memory cells arranged in a column direction and a row direction to form a matrix. Each of the memory cells has a stacked gate type MOS transistor structure in which a control gate and a floating gate are stacked.

The memory cell array 11 is formed on a well area insulated and separated from the other components. To erase data from a memory cell in the memory cell array 11, the following erase method is employed: an erase operation is divided into a plurality of steps so that an erase voltage applied to the well area is increased in increments of a specified value in each step starting with an initial voltage.

Further, the memory cell array 11 is provided with a redundancy column used to repair bad cells. Furthermore, an initial setting data area (not shown in the drawings) is set in the memory cell array 11 to store initial setting data.

The memory cell array 11 is provided with a plurality of word lines and bit lines that cross one another. The plurality of word lines are selectively driven by a decoder output from a row decoder 12.

When data is read, a signal read from a memory cell in the memory cell array 11 is supplied to a page buffer 13 via a bit line. The signal is then sensed in the page buffer 13. A column gate 14 then selects a column from the data sensed by the page buffer 13 and supplies the selected column to an I/O bus 15. Then, an I/O buffer 16 further outputs the column to equipment located outside the chip.

When data is written, externally supplied write data is supplied to the I/O buffer 16, then to the I/O bus 15, and then to the column gate 14. Furthermore, a voltage transmitted via the page buffer 13 and corresponding to the write data is supplied to a bit line. The data is then written in a selected memory cell.

Further, when data is written, the I/O buffer 16 is supplied not only with write data but also with an address used to select a memory cell and a command used to control operations of the memory, the address and command being supplied by equipment located outside the chip.

Then, the address is loaded into an address buffer 17, and the command is loaded into a command buffer 18. Of the address loaded into the address buffer 17, a row address is supplied to the row decoder 12 and a column address is supplied to the column gate 14.

If a bad column occurs in the memory cell 11, a bad column address register 19 stores a bad column address corresponding the bad column to be subjected to a redundancy repair.

The memory according to this embodiment is not provided with a block redundancy but instead detects a bad block to display a corresponding flag to show a user the address of the bad block. Flag information on the bad block is stored in a latch in the row decoder 12. The bad column address register 19 is connected to the I/O bus.

A voltage generator 20 generates various voltages used inside the chip. These voltages include, for example, Vref (reference voltage), Vpgm (write voltage), an internal drop voltage (Vdd), an erase voltage (Verase), and an unselected cell word line voltage (Vread) supplied to word lines for unselected cells. The voltages generated by the voltage generator 20 are supplied to the row decoder 12 and others.

A trimming data register 21 stores adjustment data (trimming data) used by the voltage generator 20 to generate the above voltages.

A timer 22 generates various timing pulses used inside the chip.

A trimming data register 23 stores adjustment data (trimming data) used by the timer 22 to generate the above timing pulses.

The trimming data registers 21 and 23 act as fuses in the prior art. That is, when the memory is powered on, data to be stored in the registers is read from the initial setting data area, described later, in the memory cell array 11. The data is sequentially stored in the registers 21 and the 23 via the I/O bus 15.

An I/O control 24 loads various control signals such as a chip enable signal /CE, a read enable signal /RE, and write enable signal /WE which are supplied by external equipment.

A control logic 25 is supplied with a control command loaded into the I/O control 24 and a command loaded into the command buffer 18.

The control logic 25 controls operations of the circuits inside the chip on the basis of the results of decoding of the control signal and command from the I/O control 24 (this control includes sequence control for data writes and data erasures). The control logic 25 contains various registers used to store control data. Further, the control logic 25 has a function of outputting a ready/busy signal (R/Bn) indicating whether or not the chip is accessible.

To write data, the control logic 25 executes a series of control operations including a write operation performed on a selected memory cell, a verify operation for checking a write status, and another write operation performed on a memory cell with a insufficient write status. To erase data, the control logic 25 executes a series of control operations including an erase operation performed on a selected block, a verify operation for checking an erase status, and another erase operation performed on a memory cell with a insufficient erase status.

Figure 11:
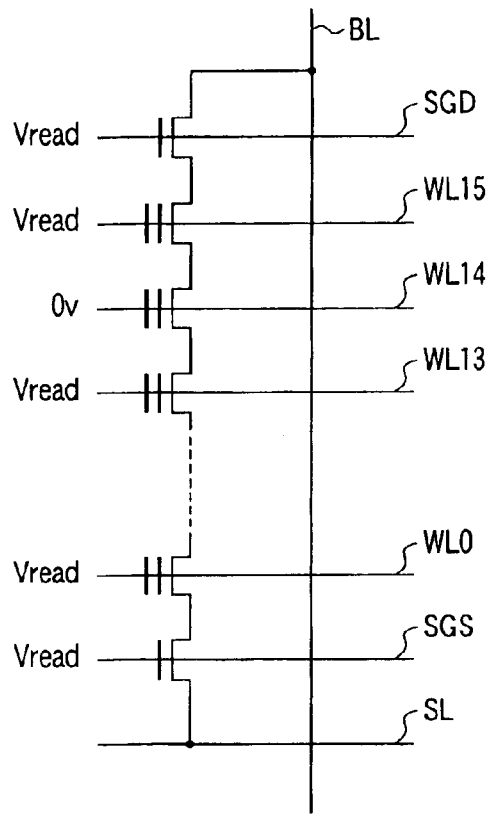
FIG. 11 is an equivalent circuit diagram showing a bias relationship observed in a memory cell unit when a read is executed on the NAND type flash memory.
Figure 15:
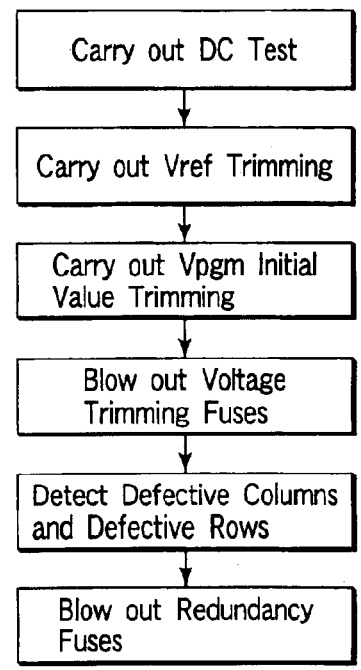
FIG. 15 is a flow chart showing schematically a wafer test sequence for a conventional NAND type flash memory.
Figure 12:
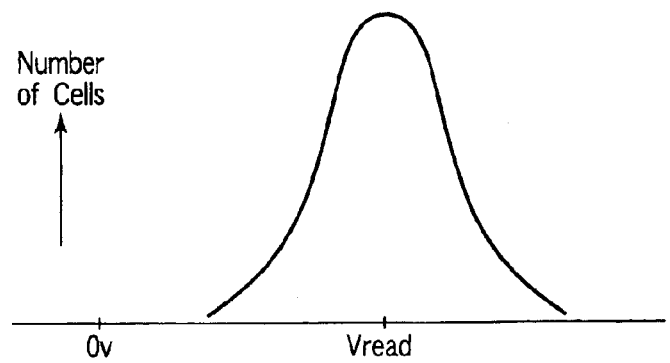
FIG. 12 is a distribution diagram showing a variation in a threshold for a cell transistor after a write in the case in which an appropriate write bias is applied to the whole chip of the NAND type flash memory.
Figure 13:
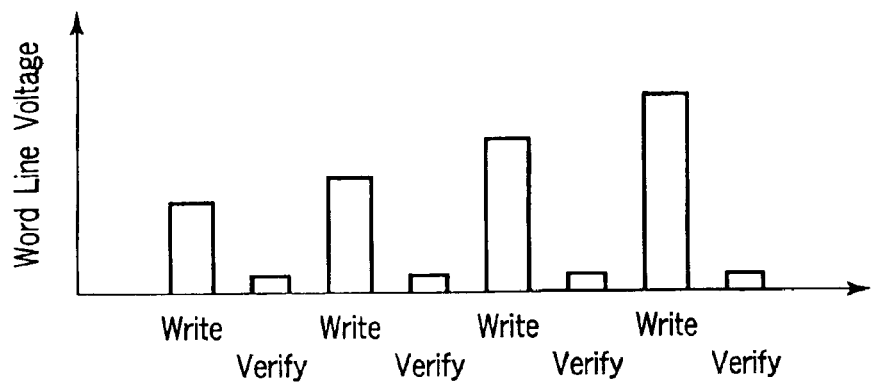
FIG. 13 is a graph showing a temporal variation in write bias observed when a verify write is executed on the NAND type flash memory.
Figure 14:
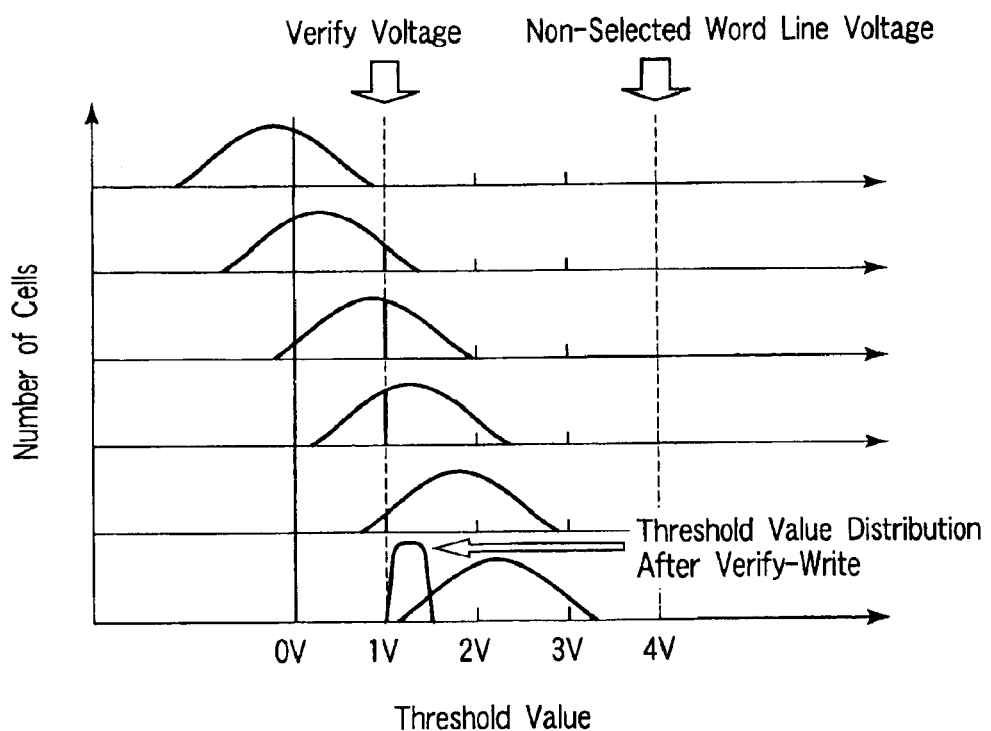
FIG. 14 is a characteristic diagram showing a variation in write bias and the distribution of the threshold for the cell transistor observed when a verify write is executed on the NAND type flash memory.

FIG. 2 shows an equivalent circuit of a part of the memory cell array 11 in FIG. 11.

The memory cell array is composed of electrically rewritable nonvolatile memory cells arranged in a matrix. Each memory cell has, for example, a stack gate type MOS transistor (cell transistor) in which a floating gate is formed in an element formed area via a tunnel insulating film, the element formed area being partitioned by an element separation insulating film of a p type silicon substrate, and in which a control gate is stacked on the floating gate via an inter-gate insulating film.

In this example, the memory cell array is composed of a large number of NAND cell units each having 16 cell transistors connected in series and a large number of selection data transistors, the cell and gate transistors being arranged in a matrix.

In this case, adjacent cell transistors in the NAND cell units share their source and drain diffusion layers. One end of each NAND cell unit is connected to a bit line BL via a selection gate transistor S1. The other end id connected to a common source line SL via a selection gate transistor S2.

Control gates of the 16 cell transistors are contiguously disposed in one direction to form word lines WL0 to WL15. Gate electrodes of the selection gate transistors S1 and S2 have a stacked gate structure similar to that of the cell transistors. In this case, the stacked gate electrodes are contiguously disposed in the same direction as that of the word line WL to form selection gate lines SGD and SGS without separating the floating gate. The cell array is covered with an interlayer insulating film, with the bit lines (BL) formed on the interlayer insulating film.

Appropriate one or more of a plurality of cell blocks B0, B1, . . . , Bn in the memory cell array 1, e.g. the cell block Bn is used as an initial setting data area to store initial setting data.

The bit lines BL and the word lines WL can be selectively driven to write data in or erase or read data from the initial setting data area. However, while an EEPROM is operating normally, no external accesses are permitted. Accordingly, whether data is erased at a time or a certain block of the data is erased, this initial setting data area 3 is not set for erase conditions. Therefore, no data is erased from the initial setting data area.

The word lines WL0 to WL15 through the 16 cell transistors connect a plurality of NAND cell units together. The plurality of NAND cell units constitute a cell block, a minimum unit for data erasure. A plurality of cell blocks B0, B1, . . . , Bn are arranged via the common bit lines BL.

The extent of memory cells selected by one word line WL is called "one page". A data write operation is performed on the entire page at a time. For example, write data retained in a data register for 512 bytes is written at a time through a bit line.

Figures 3, 4:
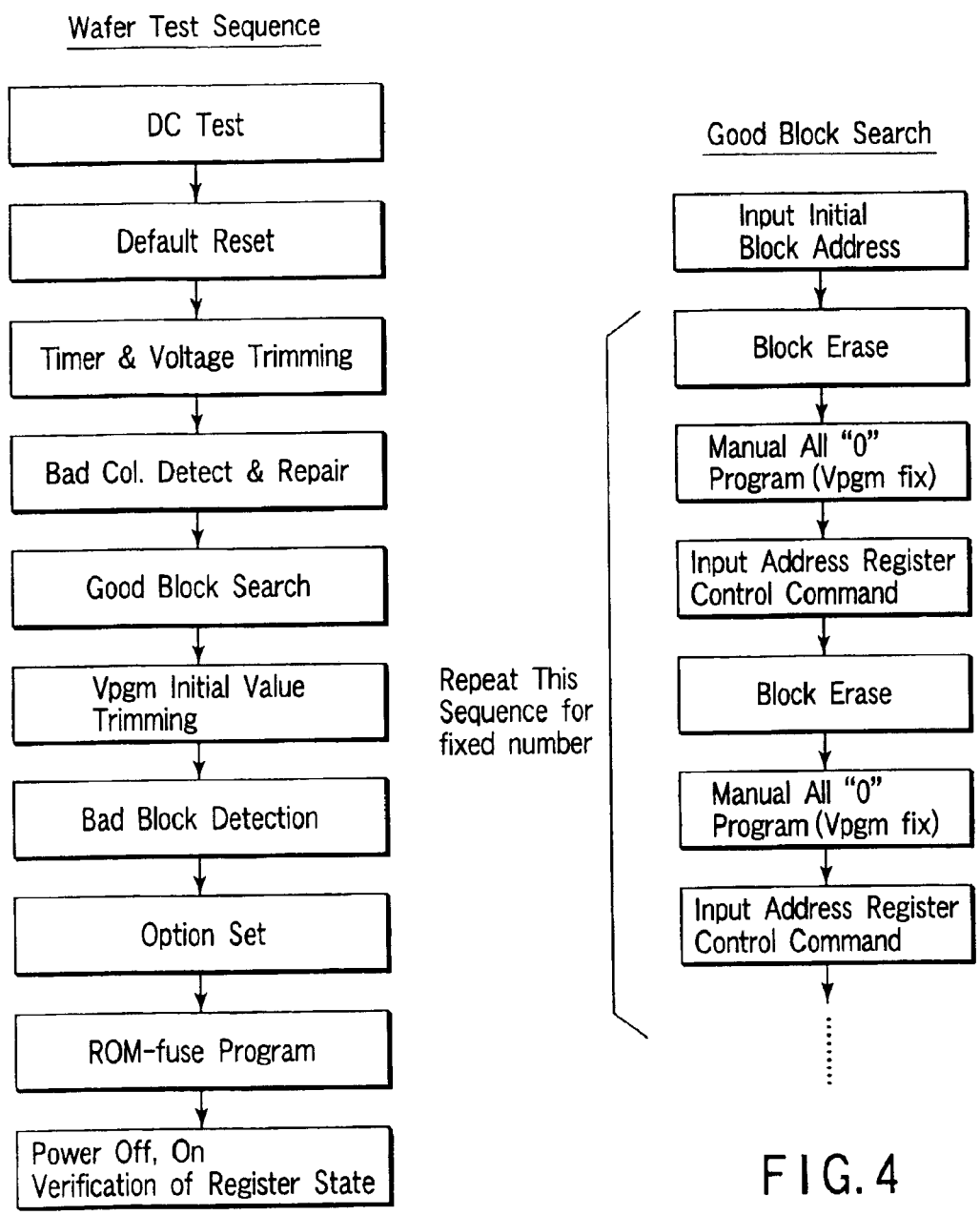
FIG. 3 is a flow chart showing a wafer test sequence for the memory in FIG. 1.
FIG. 4 is a flow chart showing a sequence of a search the memory in FIG. 1 for a normal memory block.

FIG. 3 is a flow chart showing steps executed during a wafer test on the NAND type flash memory.

Now, the wafer tests steps will be described with reference to the flow chart in FIG. 3.

(1) DC Test

First, a DC test is carried out. This test cannot be automated. However, it occupies only a small percentage of the total test time. Accordingly, it does not significantly affect the test time.

(2) Default Reset

All the registers are set to have a default status (initial status). The trimming data registers 21 and 23 are reset to contain respective default trimming values. On the other hand, the bad column address register 19 and the bad block flag are reset to indicate no bad columns and no bad blocks.

(3) Timer & Voltage Trimming

The pulse width of a pulse signal generated by the timer 22 is trimmed. The values of voltages generated by the voltage generator 20 are trimmed. The trimmed voltages are the reference voltage Vref, the internal drop voltage Vdd, and the unselected cell word line voltage Vread.

(4) Bad Column Detection & Repair

In the prior art, a normal memory block (a good block) is detected, and after the initial value of Vpgm has been trimmed, a bad column is detected. However, the presence of a bad column may result in no good memory blocks in the chip. This is because whether or not a memory block is normal is determined by executing a write and erasure on this block to check whether or not it passes a batch detection and because the presence of a bad column causes a batch detection to always fail.

Thus, after a bad column detection and repair, the memory according to this embodiment is searched for a good block (good block search). Then, the initial value of Vpgm is trimmed (Vpgm initial value trimming).

To carry out a bad column detection and repair before the initial value of Vpgm is trimmed, it is necessary to detect a bad column without executing a write and erasure. Thus, a bad column is detected by carrying out a leak check, an open check, or the like. Conversely, since such a method can be used to detect a bad column, the step of detecting a bad column can be executed before the step of trimming the initial value of Vpgm.

(5) Good Block Search

A write operation for determining an initial value for Vpgm must be performed in a block on which a write and erasure can be executed. Thus, the memory is searched for a normal memory block.

FIG. 4 is a flow chart showing a sequence of steps of searching for a good memory block.

First, an appropriate initial block address is inputted. The initial block address may not be a leading block address. Then, a block erase command is inputted to erase this block.

Following the erase operation, an erase verification is carried out (it is checked whether or all data has become "1"). The result of the verification is stored in a first status register provided in the control logic 25 in FIG. 1.

Then, a manual program command is inputted to write "0" in all the blocks. In this manual programming, one write loop is used and the voltage Vpgm is set at the maximum value or a value close to it. After the programming, a verify operation is performed. The result of the verification is stored in a second status register also provided in the control logic 25 or the like (Manual All "0" Program (Vpgm fix)).

Subsequently, an address register control command is inputted. Thus, if one or both of the first and second status registers contain the data "fail", the block address is incremented. If both status registers contain the data "pass", the address remains unchanged.

Instead of checking the contents of the first and second status registers as described above, the above operation may be performed by using one status register that accumulatively stores the data "pass/fail". That is, a status register may be provided in which if the last erase or write verification results in "pass", the data in the register remains unchanged but in which if the last erase or write verification results in "fail", the register is forced to have a first signal status. Then, if the register data is "fail", the block address is incremented. When an erasure and a write are carried out after setting this status register to have a pass status, if either the erasure or write fails, this register has a fail status. Consequently, the single status register can be used to provide functions similar to those described above.

The sequence from the erasure of a block till the input of an address register control command is repeated a predetermined number of times. As a result, once the sequence is ended, the block address buffer contains the addresses of good blocks from each chip. This operation can be completely concurrently like timer trimming and voltage trimming. The role of the address register control command corresponds to the role of a register control command in timer trimming and voltage trimming.

(6) Vpgm Initial Value Trimming

Figure 5:
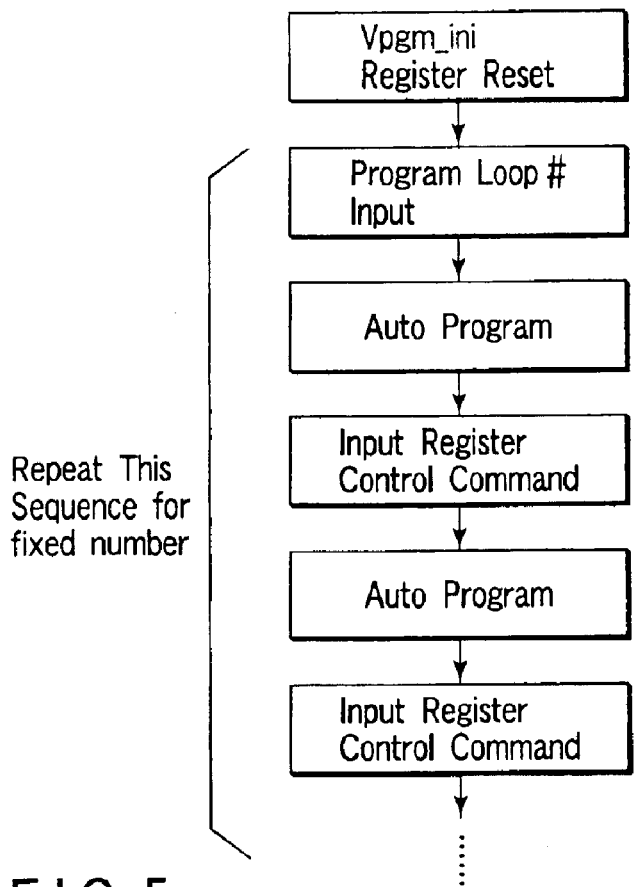
FIG. 5 is a flow chart showing a sequence of Vpgm initial value trimming executed on the memory in FIG. 1.

FIG. 5 is a flow chart showing a sequence for the Vpgm initial value trimming.

First, a register storing the initial value of Vpgm is reset (Vpgm initial register reset). This register functions as a counter to increment the data in the register when the control circuit provides an increment signal.

Then, the desired number of program loops is inputted and stored in a predetermined register (program loop # input). In this state, an auto program is executed to increase the voltage Vpgm by an amount corresponding to the inputted number of loops. Pass/fail information obtained after the program is stored in the second status register.

In this stage, when a register control command is inputted (input register control command), if the status of the program is "fail", the initial value of Vpgm in the register is incremented. If the program status is "pass", the register status is maintained. Accordingly, after the set of this auto program and register control has been repeated the predetermined number of times, the Vpgm initial value register contains such an initial value of Vpgm as allows a write to be finished with the desired number of program loops.

Figure 6:
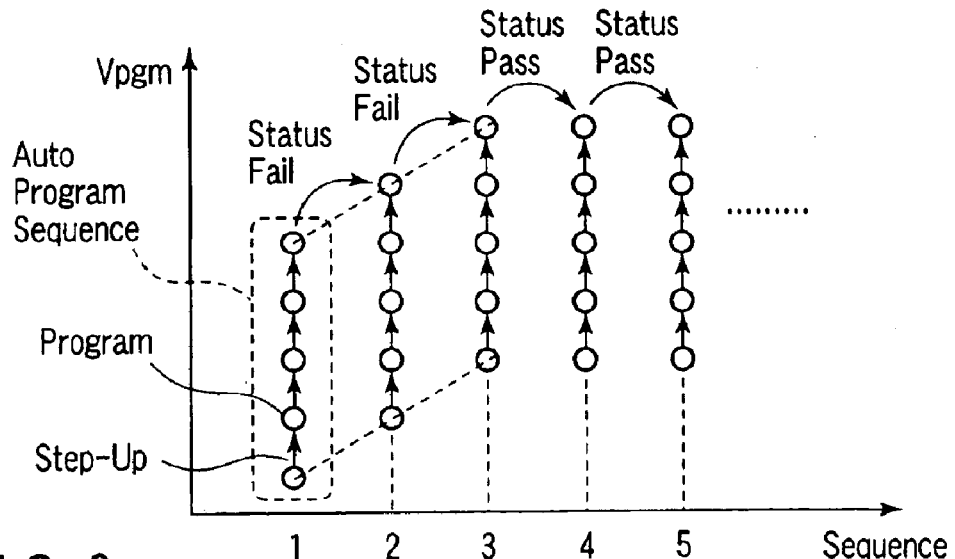
FIG. 6 is a flow chart showing how a write voltage Vpgm varies during the sequence in FIG. 5.

FIG. 6 is a flow chart showing how the write voltage Vpgm varies during the sequence. In this case, the number of program loops is set at five.

For the first write sequence, the initial value of Vpgm is set at its minimum value. Then, the value of Vpgm is increased four times (step up). Subsequently, the status is determined. While the status is "fail" (status fail), the initial value Vpgm is continuously incremented. Once the status becomes "pass" (status pass), the initial value of Vpgm remains unchanged. Thus, after this sequence has been repeated the predetermined number of times, the initial value of Vpgm is set at its optimum value in accordance with the chip.

In this regard, while the program is being executed, the unselected word line voltage Vpass is increased. The initial value of Vpass may be set to vary in unison with the initial value of Vpgm.

Further, here, only the method of optimizing the initial value of Vpgm has been described. However, the initial value of the erase voltage Verase can be optimized as required using a similar method.

Referring back to FIG. 3, the wafer test sequence will be described.

(7) Bad Block Detection

The NAND type flash memory displays a flag (bad block flag) for a bad block without executing a redundancy repair on this block.

(8) Option Set

Of the data to be stored in the initial setting data area in the memory cell array 11, the above operations have provided information on the various trimming operations and defects in the cell array. Further, information on chip options is written in the initial setting data area; information is written in this area indicating whether the chip is treated as a multivalued product or a binary product. Such information is inputted to each chip through a tester. The inputted data is stored in a predetermined register.

(9) ROM-Fuse Program

Then, the data stored in the registers is sequentially transferred to the page buffer and then written in the initial setting data area. Once the write is finished, the power supply is turned off and on again. In the chip, power on is sensed to read the data from the initial setting data area and then sequentially transfer the data to the registers. This reflects the information on the various trimming operations and defects in the cell array in the subsequent chip operations. To verify this, the various voltages and timer are monitored or write/erase/read operations are performed on the memory cell, as required.

(10) Power Off, On Verification of Register State

Of the above described wafer test, the steps starting with the (2) default reset and ending with the (9) Rom-fuse program are executed after the power supply has been turned on and without turning it off.

Now, detailed description will be given of the characteristics of the NAND type flash memory according to the present invention.

FIGS. 7A and 7B are a block diagram showing an example of a circuit that sets a write start voltage in the NAND type flash memory in FIG. 1, and a timing waveform diagram showing an example of operations of this circuit, respectively.

In FIGS. 7A and 7B, an N-bit binary counter (first counter) 71 composed of a plurality of registers can increase its count at $2^m$ increments in accordance with a first clock CLK1 after an initial value has been set. The binary counter register 71 supplies its output to a write voltage control circuit 77 as write voltage data. The clock CLK1 is supplied whenever a verify operation after a write fails. The write voltage data increases upon each failure to increase a write bias for a rewrite.

The first counter 71 can be allowed to increase its count at $2^m$ increments by inputting the clock CLK1 to a stage following the one corresponding a bit in its output (binary data) which bit has a weight of $2^m$.

Once an L-bit binary counter (second counter) 72 composed of a plurality of registers is reset using a first timing and an L-bit initial value is set, the binary counter 72 can increase its count at $2^k$ (k<m) increments. The binary counter 72 then supplies its output to the first counter 71 as write initial voltage data.

As a verify write operation proceeds, a write control circuit 78 references the contents of a first register 73 to generate the clocks CLK1 and CLK2.

The first register 73 is used to set the number of writes executed repeatedly on target write unit arrays during a test and can be set using an external input.

In this case, the second counter 72 is reset when the target write unit array is newly selected.

A second register 75 is used to store data E indicating the number of write units to be used for a test for determining an appropriate value for the write voltage or the number of write units that have been executed for this test. External data is inputted to the second register 75 or the register 75 counts the number of tests conducted.

Furthermore, a binary counter (third counter) 74 composed of a plurality of registers is provided as an accumulative-value storage circuit that stores a value corresponding to an accumulative value for the contents of the second counter 72 obtained from the results of the test based on the plurality of write units. The third counter 74 is reset using a second timing different from that for the second counter 72 (it is reset at the start of the test but not when the target write unit array is newly selected), and increases its count in accordance with the clock CLK2.

An average circuit 79 receives data D from the third counter 74 and the test number data E from the second register 75 to execute logical processing corresponding to the data D/E to calculate the average value of the number of writes used for the test based on the plurality of write units. In this case, if the test number data E is represented by i bits, data is taken out from the count in the third counter 74, the data containing higher bits but being free from the lower i bits. A predefined offset voltage is added to the calculated average value. The sum is written in a nonvolatile storage element 76 as an initial value for the write voltage.

The above configuration has been described by focusing on the verify write operation. However, the write may be replaced with an erasure if attention is paid to a verify erase operation.

Figure 8:
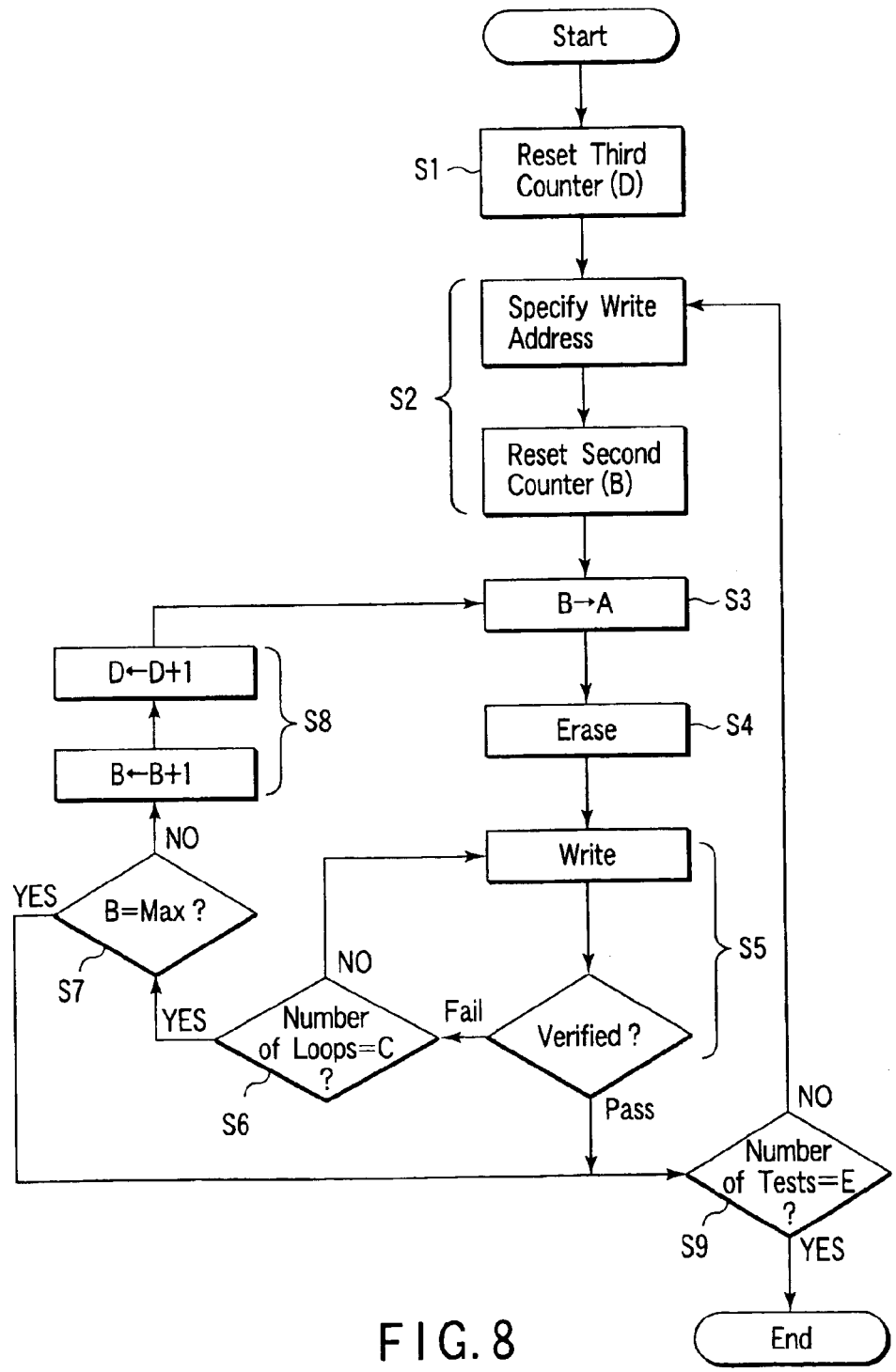
FIG. 8 is a flow chart showing a test method of setting an appropriate value for a write voltage (or an erase voltage) using the circuit in FIG. 7.
Figure 9:
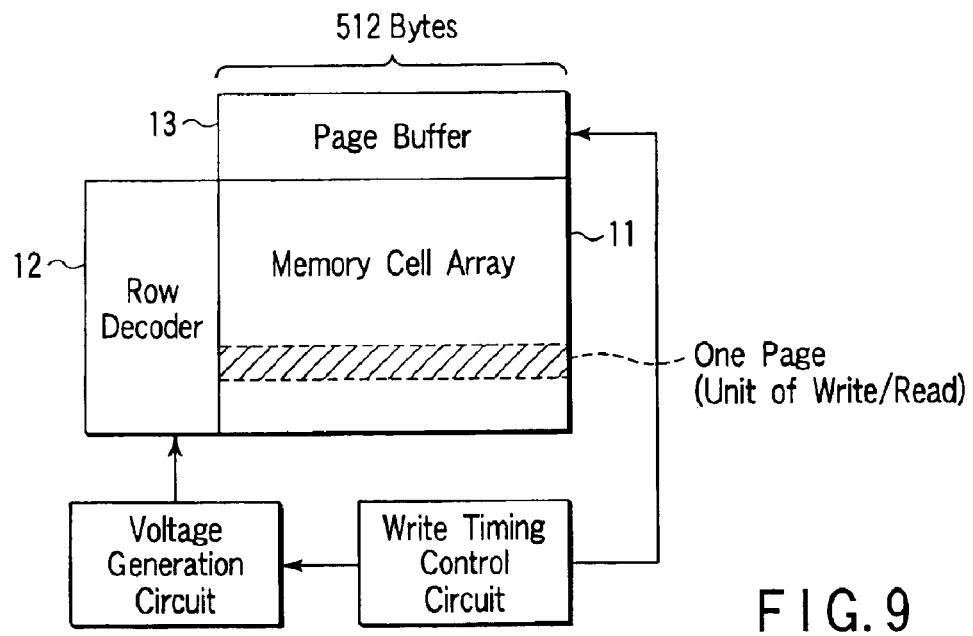
FIG. 9 is a block diagram showing schematically a related configuration in order to describe a read/write operation performed by the NAND type flash memory.
Figure 10A:
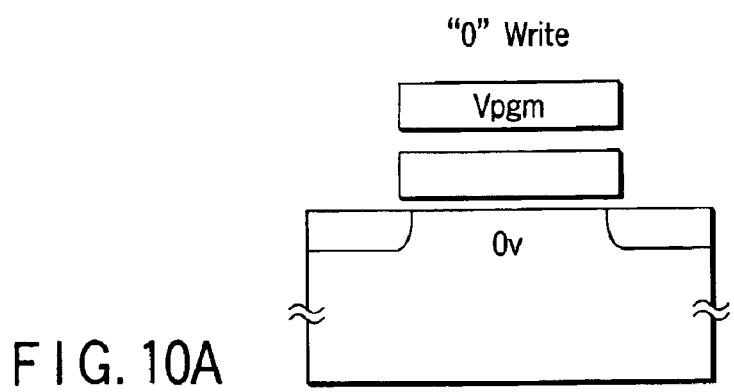
FIGS. 10A and 10B are sectional views showing a bias relationship observed when "0" data is written in a memory cell (cell transistor) of the NAND type flash memory and a bias relationship observed when "1" data is written in the memory cell of the NAND type flash memory, respectively.
Figure 10B:
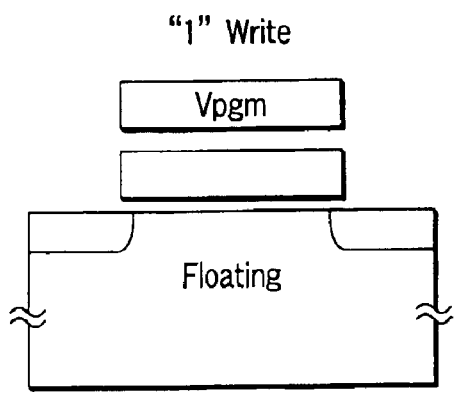

FIG. 8 is a flow chart showing an example of a test method of using the circuit in FIG. 7A to set an appropriate value for the write voltage.

(Step S1)

The number of writes executed repeatedly on target write unit arrays during a test is set in the first register 73. Then, the third binary counter 74 is reset.

(Step S2) A write address is specified to select a first write unit (or erase unit). Then, the second counter 72 is reset.

(Step 3)

The value in the second counter 72 indicating the write start voltage is loaded (set) into the first counter 71.

(Step S4)

An erasure is executed on a memory cell in the target write unit array.

(Step S5)

A write and a write verification are executed on the memory cell in the target write unit array at the write voltage set in the first counter 71. If the result of the verification is "pass" (the write has been completed), the procedure proceeds to step S9. If the result of the verification is "fail" (the write has not been completed), the procedure proceeds to step S6.

(Step S6)

The first clock CLK1 is generated to increment the count (indicating the write voltage) in the first counter 71. Then, it is determined whether or not the count in the first counter 71 has reached the number of times set in the first register 73. If the count has not reached the set number of times, the procedure returns to step S5. If the count has reached the set number of times, the procedure proceeds to step S7. If the procedure returns to step 5, a write and a write verification are executed on the memory cell in the target write unit array using the new count (indicating a higher voltage) in the first counter 71. That is, the loop operation in step 5S is repeated until the result of the write verification becomes "pass" or it is repeated the number of times set in the first register 73.

(Step S7)

It is determined whether or not the count in the second counter 72 has reached its maximum value MAX (maximum write start voltage). If the count has not reached the maximum value MAX (that is, even though the operations in steps S5 and S6 have been repeated until the count in the second counter 72 reaches its maximum value MAX, the result of the write verification is "fail"), the procedure exits the loop and proceeds to step S9.

(Step S8)

The second clock CLK2 is outputted to increment the count in the second counter 72, while incrementing the count in the third counter 74. Then, the procedure returns to step S3. If the procedure returns to step S3, operations in step S4 and the subsequent steps are preformed at a new higher start voltage.

(Step S9)

When the procedure exits the loop in step S5 or S, the test on the first write unit (or erase unit) is finished. It is then determined whether or not the test number specified by the second register 75 has been reached. If the test number has not been reached (No: the test number is insufficient), the procedure returns to step S2. If the test number has been reached (Yes), the test is ended.

If the procedure returns to step S2, a second write unit (or erase unit) is selected to shift again to the test based on the operations during step S2 and subsequent steps. The above test is repeated until the test number specified by the second register 75 has been reached.

In this case, the second counter 72, in which the appropriate write start voltage for the first write unit is stored, is reset. In contrast, the third counter 73 is not reset.

Accordingly, the count in the third counter 74 corresponds to the sum of the counts in the second counter 72 shown during repeated tests based on the operations during step S2 and subsequent steps, i.e. a binary accumulative value indicative of the number of writes executed after a test on each write unit has been started and before the write is completed.

Once the test is finished, the count up operation is stopped for the counters 71, 72, and 73 is stopped. Then, the average circuit 79 calculates the average value of the number of writes executed during the tests on the plurality of write units. The average circuit 79 adds a predefined offset voltage to this average value to obtain an initial value for the write voltage. The average circuit 79 then writes this initial value in the nonvolatile storage element 79.

In normal operation, a write operation is started after the initial value stored in the nonvolatile storage element 76 has been loaded into the second counter 72 (or an equivalent register) internally and automatically or on the basis of an externally inputted command, with this value in the register (or this value plus a predefined value) subsequently loaded into the first counter 71.

Although the flow chart in FIG. 8 shows an example of a method of setting an appropriate value for the write voltage, an appropriate value for the erase voltage can also be set in conformity with the flow chart in FIG. 8 (by replacing the write with an erasure).

As described above, according to an embodiment of the nonvolatile semiconductor memory and its test method of the present invention, an appropriate value for a write or erase start voltage can be set for each chip on the basis of an average value obtained from a plurality of write units or erase units. Consequently, the memory is expected to operate stably. Further, the average value can be determined very easily. This simplifies the configuration of the circuit to shrink the memory chip effectively.

The present invention is not limited to the above embodiment. Many modifications or variations may be made to these embodiments without departing from the spirits of the present invention. Accordingly, the nonvolatile semiconductor memory according to the present invention is not limited to an integrated circuit used exclusively for a memory but includes an integrated circuit on which a memory is mounted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory comprising a memory chip comprising:

a nonvolatile memory cell array;

a write circuit which repeatedly executes a write and a verification on one write unit in the memory cell array to complete a verify write on the write unit; and a write voltage control circuit which changes a write voltage in each write executed repeatedly by the write circuit, wherein the change of the write voltage is carried out from an initial write voltage, and the initial write voltage is obtained from an average value of optimum initial write voltages obtained in advance for respective write units.

2. A nonvolatile semiconductor memory according to claim 1, wherein the nonvolatile memory cell array comprises electrically rewritable nonvolatile memory cells arranged in a matrix, each of the memory cells comprises a stack gate type MOS transistor in which a floating gate electrode is formed on a silicon substrate with an tunnel insulating film provided therebetween and a control gate electrode is formed on the floating gate electrode with an inter-gate insulating film provided therebetween.

3. A nonvolatile semiconductor memory according to claim 1, wherein the nonvolatile memory cell array comprises a NAND flash memory cell array.

4. A nonvolatile semiconductor memory according to claim 3, wherein the NAND flash memory cell array comprises a plurality of NAND cell units arranged in a matrix each including a plurality of cell transistors connected in series and a pair of select gate transistors one of which is connected to a first terminal of the series connection of the cell transistors and the other of which is connected to a second terminal of the series connection of the cell transistors, the first terminal of the series connection of the cell transistors is connected to a bit line through said one select gate transistor and the second terminal of the series connection of the cell transistors is connected to a common source line through said other select gate transistor.

5. A nonvolatile semiconductor memory according to claim 4, wherein control gate electrodes of the cell transistors extend in one direction to form word lines, gate electrodes of the select gate transistors extend in said one direction to form select gate lines, the cell array is covered with an interlayer insulating film, and the bit lines are formed on the interlayer insulating film.

6. A nonvolatile semiconductor memory according to claim 1, wherein one or more of a plurality of cell blocks of the memory cell array is used as an initial setting data area to store initial setting data.

7. A nonvolatile semiconductor memory comprising a memory chip comprising:

a nonvolatile memory cell array;

an erase circuit which repeatedly executes an erase and a verification on one erase unit in the memory cell array to complete a verify erase on the erase unit; and an erase voltage control circuit which changes an erase voltage in each erase executed repeatedly by the erase circuit, wherein the change of the erase voltage is carried out from an initial erase voltage, and the initial erase voltage is obtained from an average value of optimum initial erase voltages obtained in advance for respective erase units.

8. A nonvolatile semiconductor memory according to claim 7, wherein the nonvolatile memory cell array comprises electrically rewritable nonvolatile memory cells arranged in a matrix, each of the memory cells comprises a stack gate type MOS transistor in which a floating gate electrode is formed on a silicon substrate with an tunnel insulating film provided therebetween and a control gate electrode is formed on the floating gate electrode with an inter-gate insulating film provided therebetween.

9. A nonvolatile semiconductor memory according to claim 7, wherein the nonvolatile memory cell array comprises a NAND flash memory cell array.

10. A nonvolatile semiconductor memory according to claim 9, wherein the NAND flash memory cell array comprises a plurality of NAND cell units arranged in a matrix each including a plurality of cell transistors connected in series and a pair of select gate transistors one of which is connected to a first terminal of the series connection of the cell transistors and the other of which is connected to a second terminal of the series connection of the cell transistors, the first terminal of the series connection of the cell transistors is connected to a bit line through said one select gate transistor and the second terminal of the series connection of the cell transistors is connected to a common source line through said other select gate transistor.

11. A nonvolatile semiconductor memory according to claim 10, wherein control gate electrodes of the cell transistors extend in one direction to form word lines, gate electrodes of the select gate transistors extend in said one direction to form select gate lines, the cell array is covered with an interlayer insulating film, and the bit lines are formed on the interlayer insulating film.

12. A nonvolatile semiconductor memory according to claim 7, wherein one or more of a plurality of cell blocks of the memory cell array is used as an initial setting data area to store initial setting data.

* * * * *